(12) United States Patent
Paik

(10) Patent No.: US 8,115,311 B2
(45) Date of Patent: Feb. 14, 2012

(54) WIRING STRUCTURE IN A SEMICONDUCTOR DEVICE

(75) Inventor: Jae-Cheol Paik, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/894,530

(22) Filed: Sep. 30, 2010

(65) Prior Publication Data

US 2011/0018141 A1     Jan. 27, 2011

Related U.S. Application Data

(62) Division of application No. 12/172,836, filed on Jul. 14, 2008, now Pat. No. 7,829,458.

(30) Foreign Application Priority Data

Jul. 18, 2007   (KR) .................. 10-2007-0071728

(51) Int. Cl.
*H01L 23/48* (2006.01)
(52) U.S. Cl. .. 257/750; 257/773; 257/774; 257/E21.576
(58) Field of Classification Search .................. None
See application file for complete search history.

(56) References Cited

U.S. PATENT DOCUMENTS 6,137,175 A * 10/2000 Tabara ........................ 257/750
6,936,510 B2    8/2005 Itabashi et al.

FOREIGN PATENT DOCUMENTS

| KR | 1020010087663 A | 9/2001 |
| KR | 1020040105949 A | 12/2004 |
| KR | 1020060029006 A | 4/2006 |

* cited by examiner

*Primary Examiner* — Dung A. Le
(74) *Attorney, Agent, or Firm* — Volentine & Whitt, PLLC

(57) ABSTRACT

A wiring structure includes a first insulation layer located on a substrate, and first and second plugs located on the substrate and extending through the first insulation layer. The first plug includes an upper peripheral portion that defines a recess and the second plug is adjacent to the first plug. A second insulation layer is located on the first insulation layer, the first plug and the second plug. A bit line structure is located on the second insulation layer and is electrically connected to the first plug. A protection spacer is located on the recess of the first plug and a sidewall of an opening in the second insulation layer. The opening exposes the recess of the first plug, the second plug and the sidewall of the bit line structure. A pad is located in the opening and contacts the second plug.

8 Claims, 6 Drawing Sheets

WIRING STRUCTURE IN A SEMICONDUCTOR DEVICE

CROSS-REFERENCE TO RELATED PATENT APPLICATION

This application is a divisional application of application Ser. No. 12/172,836 filed on Jul. 14, 2008, which claims priority from Korean Patent Application No. 10-2007-0071728, filed on Jul. 18, 2007, in the Korean Intellectual Property Office, the disclosures of which are hereby incorporated by reference in their entireties.

BACKGROUND OF THE INVENTION

1. Field of the Invention

Embodiments of the present invention relate to a wiring structure in a semiconductor device and a method of forming a wiring structure in a semiconductor device. More particularly, embodiments of the present invention relate to electrical connections of a wiring structure in a semiconductor memory device, and a method of forming the wiring structure.

2. Description of the Related Art

As semiconductor devices become more highly integrated, the size of wiring within the semiconductor devices, as well as the intervals between adjacent wirings, have been considerably reduced. Accordingly, the wiring of highly integrated semiconductor devices may not have desired low resistance and electrical shorts may be generated between adjacent wirings having minute sizes.

In forming minute wiring and a plug (or contact) contacting the wiring, alignment errors may occur between the wiring and the plug, causing an electrical failure between the plug and the wiring, or between the plug and an adjacent wiring. Design requirements for smaller semiconductor devices may cause more frequent electrical failures between plugs and wiring. As a result, semiconductor devices may have poor electrical characteristics and deteriorated reliability.

Accordingly, plugs or contacts having enlarged lower portions have been developed to improve the electrical connection between the plugs or contacts and the wiring in semiconductor devices. However, a plug having an enlarged lower portion may also contact wiring other than the intended wiring, causing an electrical short between the plug and unintended (adjacent) wiring, which likewise deteriorates electrical characteristics and reliability of semiconductor devices.

SUMMARY ON THE INVENTION

According to one aspect of the present invention, there is provided a wiring structure in a semiconductor device. The wiring structure includes a first insulation layer, a first plug, a second plug, a second insulation layer, a bit line structure, a protection spacer and a pad. The first insulation layer is located on a substrate. The first plug is located on the substrate and extends through the first insulation layer, and the first plug includes an upper peripheral portion that defines a recess. The second plug is located on the substrate and extends through the first insulation layer, and the second plug is adjacent to the first plug. The second insulation layer is located on the first insulation layer, the first plug and the second plug. The bit line structure is located on the second insulation layer and is electrically connected to the first plug. The protection spacer is located on the recess of the first plug and a sidewall of an opening in the second insulation layer. The opening exposes the recess of the first plug, the second plug and the sidewall of the bit line structure. The pad is located in the opening and contacts the second plug.

In example embodiments, the wiring structure may further include an etch stop layer between the first insulation layer and the second insulation layer. The opening may further expose the etch stop layer adjacent to the recess of the first plug, and the pad may further cover the etch stop layer.

In example embodiments, the recess of the first plug may have a depth of about 50 Å to about 200 Å.

In example embodiments, the bit line structure may include a bit line plug extending through the second insulation layer and contacting the first plug, a bit line located on the bit line plug and the second insulation layer, a bit line mask located on the bit line, and a bit line spacer located on sidewalls of the bit line and the bit line mask. The bit line plug may be separated from the recess of the first plug and partially buried in the first plug.

In example embodiments, the pad may have a lower portion and an upper portion, where the lower portion is larger than the upper portion. The lower portion of the pad may be enlarged in a direction substantially parallel to the substrate.

According to another aspect of the present invention, there is provided a method of forming a wiring structure in a semiconductor device. In the method of forming a wiring structure in the semiconductor device, a first insulation layer is formed on a substrate. A preliminary first plug and a preliminary second plug are formed on the substrate through the first insulation layer. A second insulation layer is formed on the first insulation layer to cover the preliminary first and the preliminary second plugs. A bit line structure is formed on the second insulation layer. The bit line structure is electrically connected to the first plug. An opening is formed by etching the second insulation layer to expose a sidewall of the bit line structure, the preliminary first plug and the preliminary second plug. A first plug and a second plug are formed by partially etching the preliminary first plug and the preliminary second plug. The first plug has a recess on an upper peripheral portion. A protection spacer is formed on the recess of the first plug and the sidewall of the bit line structure. A pad is formed on the second plug to fill the opening.

In example embodiments, forming the bit line structure may include forming a bit line plug on the preliminary first plug through the second insulation layer, forming a bit line on the bit line plug and the second insulation layer, forming a bit line mask on the bit line, and forming a bit line spacer on sidewalls of the bit line and the bit line mask. The bit line formed on the bit line plug formed on the preliminary first plug may have a width substantially larger than a width of an adjacent bit line formed over the preliminary second plug.

In example embodiments, the method may further include forming an etch stop layer on the first insulation layer before forming the preliminary first plug and the preliminary second plug.

In example embodiments, the method may further include forming a preliminary opening, prior to forming the opening, by etching the second insulation layer to expose the sidewall of the bit line structure and the preliminary first and the preliminary second plugs. Forming the opening may incude enlarging a lower portion of the preliminary opening using an isotropic etching process. For example, the lower portion of the preliminary opening may be enlarged in a direction substantially parallel to the substrate. Also, enlarging the lower portion of the preliminary opening may include a dry etching process, a wet etching process or a cleaning process using a plasma.

In example embodiments, enlarging the lower portion of the preliminary opening may be performed using an etching gas including a sulfur hexafluoride ($SF_6$) gas and a chlorine ($C_{12}$) gas, or a hydrogen bromide (HBr) gas, a chlorine gas and an oxygen ($O_2$) gas. Enlarging the lower portion of the preliminary opening may be performed using the plasma which is generated from a gas comprising sulfur hexafluoride and chlorine, or hydrogen bromide, chlorine and oxygen. Also, enlarging the lower portion of the preliminary opening may be performed using an etching solution including a hydrogen peroxide ($H_2O_2$) solution, an ammonium hydroxide ($NH_4OH$) solution and deionized water.

In example embodiments, forming the protection spacer may include forming a protection layer on the sidewall of the bit line structure, the second plug and the first plug, the protection layer filling the recess of the first plug. Then, the protection layer may be etched to provide the protection spacer.

According to example embodiments of the present invention, a wiring structure includes a protection spacer formed in a recess on a first plug on a substrate, so that the first plug is electrically insulated from a pad without an electrical short between the first plug and the pad. Further, the pad may make electrical contact with a second plug on the substrate without an electrical failure because the pad has a lower width larger than an upper width. Therefore, the wiring structure may have improved electrical characteristics and an increased structural stability, while preventing an electrical failure of the wiring structure. When a semiconductor device includes the wiring structure, the semiconductor device may also have improved reliability and enhanced electrical characteristics.

BRIEF DESCRIPTION OF THE DRAWINGS

The embodiments of the present invention will be described with reference to the attached drawings, in which.

DESCRIPTION OF THE EMBODIMENTS

Figure 1:
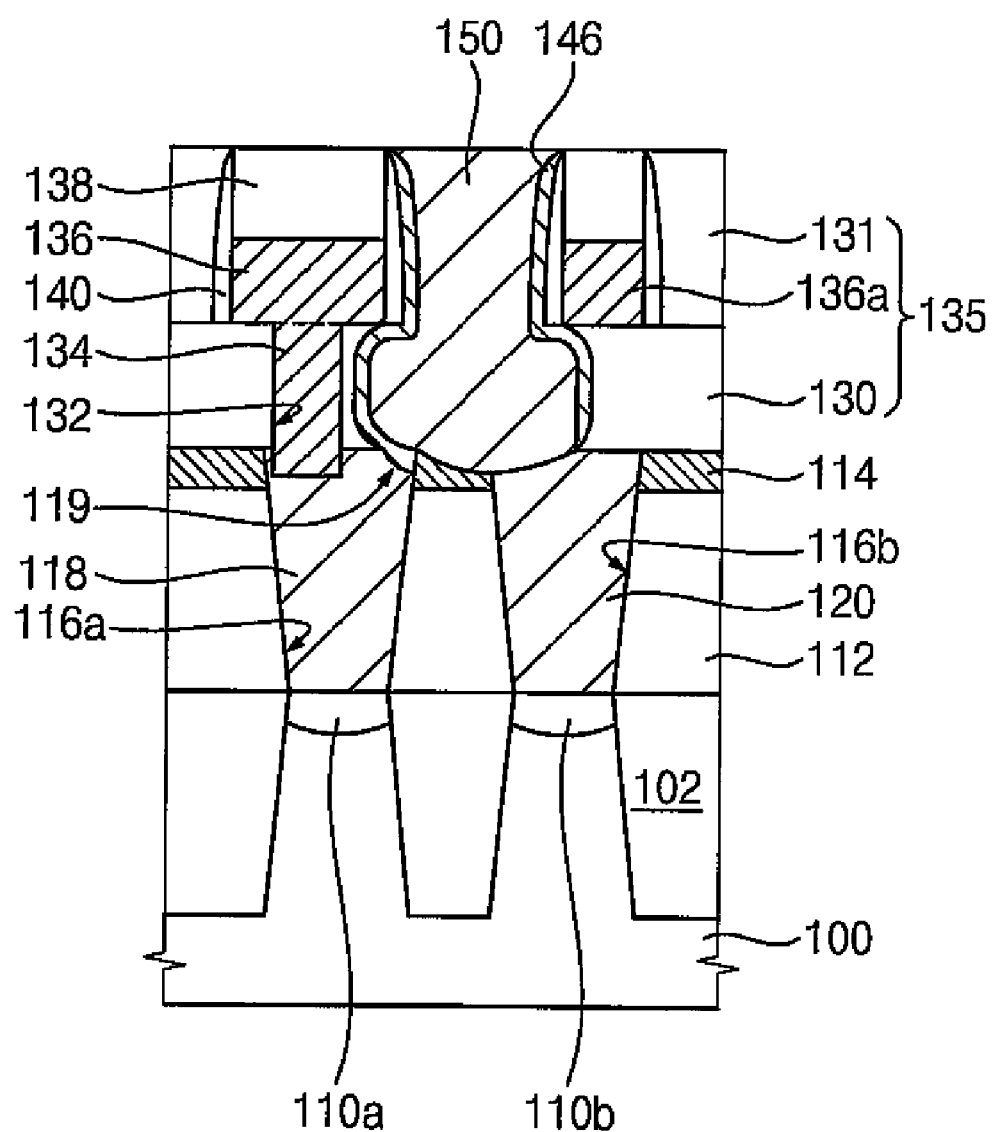
FIG. 1 is a cross-sectional view of a wiring structure in a semiconductor device, according to embodiments of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, in the drawings, the sizes and relative sizes of layers and regions are not necessarily draw to proportion and may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that although the terms first, second, third, etc., may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification and claims, specify the presence of stated features, integers, steps, operations, elements and/or components, but do not preclude the presence or addition of one or more other features, integers, steps, operations, elements, components and/or groups thereof.

Example embodiments of the invention are described herein with reference to cross-sectional illustrations that are schematic illustrations of idealized illustrative embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense, unless expressly so defined herein.

Embodiments of the present invention provide a wiring structure in a semiconductor device having enhanced structural stability and improved electrical characteristics, preventing electrical failure. Embodiments of the present invention further provide a method of forming a wiring structure in a semiconductor device, which has enhanced structural stability, improved electrical characteristics and reduced electrical failure.

FIG. 1 is a cross-sectional view of a wiring structure in a semiconductor device, according to example embodiments of the present invention.

Referring to FIG. 1, the wiring structure is provided on a substrate 100. The substrate 100 may include, for example, a silicon on insulator substrate (SOI) substrate, a germanium on insulator (GOI) substrate or a semiconductor substrate, such as a silicon substrate, a germanium substrate, a silicon germanium substrate, a gallium arsenic substrate, etc.

An isolation layer 102 is provided on the substrate 100. The isolation layer 102 may include an oxide, such as silicon oxide. For example, the isolation layer 102 may include undoped silicate glass (USG), spin on glass (SOG), followable oxide (FOX), tetraethyl ortho silicate (TEOS), plasma enhanced-tetraethyl ortho silicate (PE-TEOS), high density plasma-chemical vapor deposition (HDP-CVD) oxide, etc. The isolation layer 102 defines an active region of the substrate 100.

In example embodiments, the active region may extend in a first direction, e.g., substantially parallel to an upper surface of the substrate 100. Adjacent active regions may be separated by a field region where the isolation layer 102 is positioned. Each of the active regions may have diagonal side portions, inclined at a predetermined angle with respect to an end of the substrate 100. Alternatively, the side portions of the active regions may be arranged in a straight direction (e.g., substantially perpendicular to the first direction) relative to the end of the substrate 100.

A transistor (not illustrated) is formed in the active region of the substrate 100. Adjacent transistors may provide a word line on the substrate 100 extending in a second direction, which may be substantially perpendicular to the first direction. Each of the transistors includes a first impurity region 110a and a second impurity region 110b. In example embodiments, two word lines may extend on one active region in the second direction.

In example embodiments, the transistor may include a gate structure (not illustrated). The gate structure may include a gate insulation layer pattern, a gate electrode, and a gate mask. The gate insulation layer pattern may include an oxide or a metal oxide. For example, the gate insulation layer pattern may include silicon oxide (SiOx), hafnium oxide (HfOx), zirconium oxide (ZrOx), tantalum oxide (TaOx), aluminum oxide (AlOx), etc. The gate electrode may include doped polysilicon, a metal, a metal compound and/or a metal silicide. For example, the gate electrode may include polysilicon doped with impurities, tungsten (W), titanium (Ti), tantalum (Ta), aluminum (Al), titanium nitride (TiNx), tungsten nitride (WNx), aluminum nitride (AlNx), tantalum nitride (TaNx), tungsten silicide (WSix), titanium silicide (TiSix), cobalt silicide (Co Six), tantalum silicide (TaSix), etc. The gate mask may include a nitride or an oxynitride. For example, the gate mask may include silicon nitride, silicon oxynitride, titanium oxynitride, etc. Further, the gate structure may include a gate spacer formed on sidewalls of the gate mask, the gate electrode and the gate insulation layer pattern.

The gate spacer may include a nitride, such as silicon nitride, or an oxynitride, such as silicon oxynitride.

Referring again to FIG. 1, a first insulation layer 112 is disposed on the substrate 100 to cover the transistor. In various embodiments, the first insulation layer 112 may include an oxide. For example, the first insulation layer 112 may include boro-phosphor silicate glass (BPSG), phosphor silicate glass (PSG), USG, SOG, FOX, TEOS, PE-TEOS, HDP-CVD oxide, etc.

An etch stop layer 114 is formed on the first insulation layer 112. The etch stop layer 114 may include a material having an etching selectivity relative to the first insulation layer 112 and a second insulation layer 130. For example, the etch stop layer 114 may include a nitride, such as silicon nitride. Alternatively, the etch stop layer 114 may include a metal oxide, such as hafnium oxide, aluminum oxide, etc.

A first contact hole 116a and a second contact hole 116b are provided through the etch stop layer 114 and the first insulation layer 112. The first and the second contact holes 116a and 116b expose the first and the second impurity regions 110a and 110b, respectively. Each of the first and the second contact holes 116a and 116b may have differing upper and lower widths, and the upper width may be substantially larger than the lower width.

A first plug 118 and a second plug 120 are positioned on the first impurity region 110a and the second impurity region 110b, respectively. The first and the second plugs 118 and 120 fill the first and the second contact holes 116a and 116b, respectively. Each of the first and the second plugs 118 and 120 may include doped polysilicon, a metal and/or a metal compound. For example, the first and the second plugs 118 and 120 may include polysilicon doped with impurities, titanium, titanium nitride, tungsten, tungsten nitride, tantalum, tantalum nitride, aluminum, aluminum nitride, titanium aluminum nitride, etc., which may be used alone or in any mixture thereof.

The first plug 118 defines a recess 119. The recess 119 may be located at an upper peripheral (or edge) portion of the first plug 118, for example. Also, the recess 119 of the first plug 118 may be adjacent to the etch stop layer 114. When the recess 119 is located at the upper peripheral portion of the first plug 118, the first plug 118 does not have a sharp edge portion. The recess 119 may have a depth of about 50 Å to about 200 Å.

The second insulation layer 130 is positioned on the etch stop layer 114, the first plug 118 and the second plug 120. The second insulation layer 130 may include an oxide, such as silicon oxide. For example, the second insulation layer 130 may include BPSG PSG, SOG, USG, FOX, TEOS, PE-TEOS, IMP-CVD oxide, etc. In various embodiments, the second insulation layer 130 may include an oxide substantially the same as or similar to that of the first insulation layer 112. Alternatively, the second insulation layer 130 may include an oxide different from that of the first insulation layer 112.

A bit line structure is located on the second insulation layer 130. The bit line structure includes a bit line plug 134, a bit line 136 and a bit line mask 138. The bit line plug 134 is disposed on the first plug 118 and fills a bit line contact hole 132 formed through the second insulation layer 130. The bit line plug 134 may include doped polysilicon, a metal and/or a metal compound. For example, the bit line plug 134 may include polysilicon doped with impurities, tungsten, tungsten nitride, titanium, titanium nitride, tantalum, tantalum nitride, aluminum, aluminum nitride, etc. In example embodiments, the bit line plug 134 may be partially buried in the first plug 118. For example, a lower portion of the bit line plug 134 may extend into and be enclosed by the first plug 118. Accordingly, the electrical connection between the bit line plug 134 and the first plug 118 is enhanced, and the structural stability of the bit line plug 134 is improved. Further, in various embodiments, the bit lime plug 134 is separated from the recess 119 of the first plug 118. However, the bit line plug 134 may be adjacent to or touching the recess 119.

The bit line 136 is positioned on the bit line plug 134 and the second insulation layer 130. The bit line 136 may include doped polysilicon, a metal and/or a metal compound. For example, the bit line 136 may include polysilicon doped with impurities, tungsten, tungsten nitride, titanium, titanium nitride, tantalum, tantalum nitride, aluminum, aluminum nitride, etc. The bit line 136 may include a material substantially the same as or similar to that of the bit line plug 134. Alternatively, the bit line 136 may include a material different from that of the bit line plug 134.

In example embodiments, the bit line 136 extends along the second insulation layer 130 in a first direction, which may be substantially parallel to an upper surface of the second insulation layer 130. The bit line 136 makes electrical contact with the first impurity region 110a through the bit line plug 134 and the first plug 118. The bit line 136 positioned directly over the first plug 118 may have a width substantially wider than adjacent bit lines, such as bit line 136a, which are not positioned directly over the first plug 118. In other words, a portion of the bit line 136 on the bit line plug 134 may have a width substantially larger than any portion of another adjacent bit line 136a.

The bit line mask 138 is provided on the bit line 136. The bit line mask 138 may include a material having an etching selectivity relative to the first insulation layer 112, the second insulation layer 130, and/or a third insulation layer 131. For example, the bit line mask 138 may include a nitride, such as silicon nitride, or an oxynitride, such as silicon oxynitride.

The bit line structure additionally includes a bit line spacer 140 on sidewalls of the bit line 136 and the bit line mask 138. The bit line space 140 may include silicon nitride or silicon oxynitride, for example.

Referring again to FIG. 1, the third insulation layer 131 is formed on the second insulation layer 130 and covers the bit line structure. The third insulation layer 131 may include, for example, an oxide, such as BPSG, PSG, SOG, USG, FOX, TEOS, PE-TEOS, HDP-CVD oxide, etc. In example embodiments, the third insulation layer 131 may be planarized until the bit line structure is exposed. When the third insulation layer 131 is formed on the second insulation layer 130, an insulation structure 135, including the second and third insulation layers 130 and 131 is located over the substrate 100.

An opening extends through the third insulation layer 131 and the second insulation layer 130. The opening exposes the recess 119 of the first plug 118, the etch stop layer 114 and the second plug 120. The opening may be formed by an anisotropic etching process and an isotropic etching process, for example. The opening may include a lower portion and an upper portion, where the lower portion is wider than the upper portion. For example, the opening may have an elliptical lower portion. The lower portion of the opening may extend in a direction substantially parallel to the substrate 100.

A protection spacer 146 is disposed on an inside of the opening. The protection spacer 146 fills the recess 119 of the first plug 118. Thus, the first plug 118 is insulated from a pad 150 in the opening. The protection spacer 146 may include a nitride, such as silicon nitride, or an oxynitride, such as silicon oxynitride, for example.

The pad 150 filling the opening is provided on the second plug 120, the etch stop layer 114 and the protection spacer 146. The pad 150 may include a metal, a metal compound and/or doped polysilicon. For example, the pad 150 may include tungsten, tungsten nitride, titanium, titanium nitride, tantalum, tantalum nitride, aluminum, aluminum nitride, polysilicon doped with impurities, etc. Since the lower portion of the opening is wider than the upper portion of the opening, the pad 150 also has a lower portion wider than an upper portion. Also, like the opening, the lower portion of the pad 150 may extend in a direction substantially parallel to the substrate 100. Therefore, the electrical connection between the pad 150 and the second plug 120 is enhanced and the structural stability of the pad 150 is improved.

In example embodiments, the protection spacer 146 fills the recess 119 of the first plug 118, so that the pad 150 is effectively insulated from the first plug 118. Further, because the lower portion of the pad 150 is wider than the upper portion, the electrical connection between the pad 150 and the second plug 120, as well as the structural stability of the pad 150, are enhanced. Therefore, the wiring structure has improved electrical characteristics, without electrical failures among the pad 150, the first plug 118 and the second plug 120.

FIGS. 2 to 10 are cross-sectional views illustrating a method of forming a wiring structure in a semiconductor device, according to example embodiments of the present invention.

Figure 2:
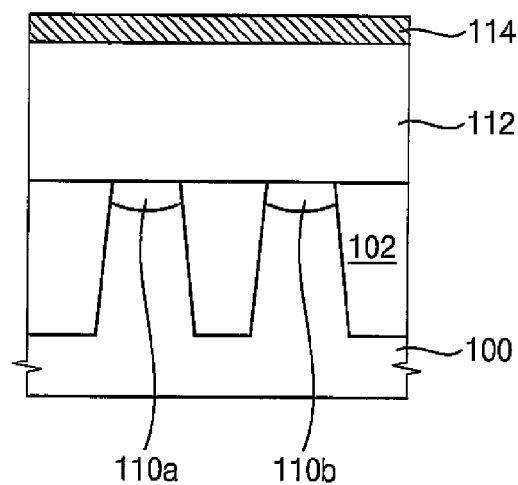
FIGS. 2 to 10 are cross-sectional views illustrating a method of forming a wiring structure in a semiconductor device, according to embodiments of the present invention.

Referring to FIG. 2, an active region and a field region of substrate 100 are defined by forming isolation layer 102 on the substrate 100. The substrate 100 may include an SOI substrate, a GOI substrate, a semiconductor substrate, etc. The isolation layer 102 may be formed using an oxide, such as silicon oxide, for example. The isolation layer 102 may be formed, for example, using a thermal oxidation process or a shallow trench isolation (STI) process.

In the STI process, according to example embodiments, a buffer oxide layer may be provided on the substrate 100, and then a nitride layer may be formed on the buffer oxide layer. The buffer oxide layer may reduce the stress generated between the substrate 100 and the nitride layer. After the nitride layer is etched to form a nitride mask on the buffer oxide layer, the buffer oxide layer and the substrate 100 may be partially etched, so that a trench is formed on the substrate 100 and a buffer oxide layer pattern is formed between the substrate 100 and the nitride mask. An oxide layer may be formed on the nitride mask to sufficiently fill the trench, and then the oxide layer may be removed until the nitride mask is exposed. As a result, the isolation layer 102 filling the trench is formed on the substrate 100.

In various embodiments, the active region may extend along a first direction. Also, as discussed above, the active region may extend diagonally, inclined by a predetermined angle with respect to an end of the substrate 100.

A gate insulation layer (not illustrated) and a gate conductive layer (not illustrated) are formed on the substrate 100. The gate insulation layer may be formed, for example, using oxide or metal oxide by a CVD process, an atomic layer deposition (ALD) process, a PECVD process, an HDP-CVD process, a sputtering process, etc. The gate conductive layer may be formed, for example, by doped polysilicon, metal, metal silicide and/or metal oxide. Further, the gate conductive layer may be formed, for example, using a CVD process, a PECVD process, a low pressure chemical vapor deposition (LPCVD) process, a sputtering process, an evaporation process, a pulsed laser deposition (PLD) process, etc.

After a gate mask (not illustrated) is formed on the gate conductive layer, the gate conductive layer and the gate insulation layer are etched to form a gate insulation layer pattern and a gate electrode on the substrate 100. Thus, a gate structure having the gate insulation layer pattern, the gate electrode and the gate mask is provided in the active region of the substrate 100. The gate mask may be formed using nitride or oxynitride, for example. The gate structure may extend on the substrate 100 in a second direction, substantially perpendicular to the first direction.

In example embodiments, a gate spacer may be additionally formed on a sidewall of the gate structure. The gate spacer may be formed by etching a nitride layer or an oxynitride layer after forming the nitride layer or the oxynitride layer on the substrate 100 to cover the gate structure. The gate spacer may be formed, for example, through an anisotropic etching process.

Using the gate structure as an implantation mask, impurities may be doped into portions of the substrate 100 adjacent to the gate structure by an ion implantation process. Hence, a first impurity region 110*a* and a second impurity region 110*b* are formed at the doped portions of the substrate 100. When the first and the second impurity regions 110*a* and 110*b* are formed, a transistor is provided in the active region of the substrate. In example embodiments, the first impurity region 110*a* may be formed at a central portion of the active region, and the second impurity region 110*b* may be formed at a peripheral portion of the active region.

A first insulation layer 112 is formed on the substrate 100 to sufficiently cover the transistor. The first insulation layer 112 may be formed, for example, by oxide, such as silicon oxide, using a CVD process, a PECVD process, a spin coating process, an HDP-CVD process, etc. In example embodiments, the first insulation layer 112 is planarized by a chemical mechanical polishing (CMP) process and/or an etch-back process, so that the first insulation layer 112 has a flat upper face.

An etch stop layer 114 is formed on the first insulation layer 112. The etch stop layer 114 may be formed, for example, by nitride or metal oxide using a CVD process, a PECVD process, an ALD process, a sputtering process, an LPCVD process, etc. The etch stop layer 114 may have a relatively thin thickness.

Figure 3:
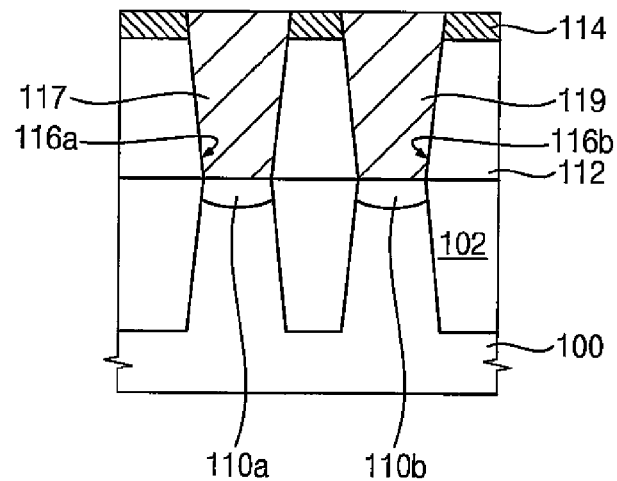

Referring to FIG. 3, a first contact hole 116*a* and a second contact hole 116*b* are formed through the etch stop layer 114 and the first insulation layer 112 by partially etching the etch stop layer 114 and the first insulation layer 112. The first and the second contact holes 116*a* and 116*b* expose the first and the second impurity regions 110*a* and 110*b*, respectively. Each of the first and the second contact holes 116*a* and 116*b* may have sidewalls inclined relative to the substrate 100. Accordingly, the first and the second contact holes 116*a* and 116*b* may have upper widths substantially larger than lower widths. When the gate structure additionally includes the gate spacer, the first and the second contact holes 116*a* and 116*b* may be formed by a self-alignment process with respect to the gate spacer.

In example embodiments, a line type photoresist pattern extending in the first direction may be provided on the etch stop layer 114. The etch stop layer 114 and the first insulation layer 112 are then etched using the line type photoresist pattern as an etching mask. Here, the first and the second contact holes 116*a* and 116*b* may be formed by etching portions of the etch stop layer 114 and the first insulation layer 112 defined by the line type photoresist pattern and the gate spacer. That is, portions of the etch stop layer 114 and the first insulation layer 112 may be etched by the self-alignment process with respect to the gate spacer.

A first conductive layer (not illustrated) is formed on the etch stop layer 114 to fill the first and the second contact holes 116*a* and 116*b*. The first conductive layer may be formed, for example, by doped polysilicon, metal and/or metal compound using a sputtering process, a CVD process, an LPCVD process, a PECVD process, a PLD process, an evaporation process, etc. The first conductive layer is removed until the etch stop layer 114 is exposed, thereby forming a preliminary first plug 117 and a preliminary second plug 115 in the first contact hole 116*a* and the second contact hole 116*b*, respectively. The preliminary first plug 117 and the preliminary second plug 115 may be formed, for example, using a CMP process and/or an etch-back process. The preliminary first plug 117 and the preliminary second plug 115 are generally shaped the same as the first contact hole 116*a* and the second contact hole 116*b*, respectively. Therefore, the preliminary first plug 117 and the preliminary second plug 115 may have upper widths substantially larger than lower widths when the corresponding first and the second contact holes 116*a* and 116*b* have upper portions substantially wider than lower portions.

In example embodiments, the etch stop layer 114 may be partially consumed while removing the first conductive layer, in which case the preliminary first plug 117 and the preliminary second plug 115 may protrude from the etch stop layer 114.

Figure 4:
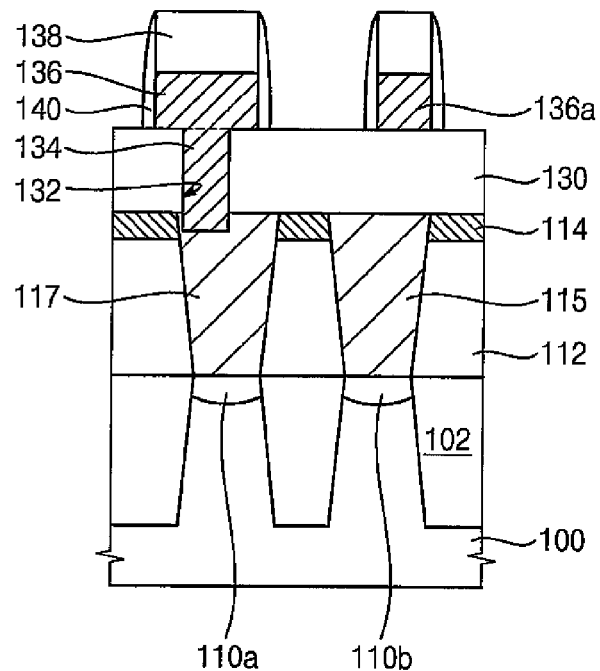

Referring to FIG. 4, a second insulation layer 130 is formed on the preliminary first plug 117, the preliminary second plug 115 and the etch stop layer 114. The second insulation layer 130 may be formed, for example, using an oxide such as silicon oxide by a CVD process, a PECVD process, a spin coating process, an HDP-CVD process, etc.

The second insulation layer 130 is partially etched to form a bit line contact hole 132, which exposes a portion of the preliminary first plug 117. In example embodiments, an upper portion of the preliminary first plug 117 is partially removed while forming the bit line contact hole 132, creating a groove in the upper portion of the preliminary first plug 117. The bit line contact hole 132 may have a width substantially smaller than a width of the preliminary first plug 117.

A second conductive layer (not illustrated) filling the bit line contact hole 132 is formed on the second insulation layer 130. The second conductive layer may be formed, for example, by polysilicon doped with impurities, metal and/or metal compound using a CVD process, an ALD process, a PECVD process, a sputtering process, a PLD process, an evaporation process, etc.

A bit line mask 138 is provided on the second conductive layer. The bit line mask 138 may be formed, for example, by nitride or oxynitride using a CVD process, a PECVD process, an LPCVD process, etc. The bit line mask 138 may extend over the substrate 100 along the first direction.

Using the bit line mask 138 as an etching mask, the second conductive layer is etched to form a bit line plug 134 and a bit line 136. The bit line plug 134 fills the bit line contact hole 132, and the bit line 136 is located on the bit line plug 134 and the second insulation layer 130. The bit line plug 134 contacts the preliminary first plug 117, and thus the bit line 136 makes electrical contact with the first impurity region 110*a* through the bit line plug 134 and the preliminary first plug 117. Accordingly, a bit line structure including the bit line plug 134, the bit line 136 and the bit line mask 138 is formed over the substrate 100. A bit line spacer 140 may be additionally provided on a sidewall of the bit line structure. The bit line spacer 140 may be formed, for example, by nitride or oxynitride, using a CVD process, a PECVD process, an LPCVD process, etc.

In example embodiments, the bit line plug 134 is partially buried in the preliminary first plug 117 when the groove is formed on the upper portion of the preliminary first plug 117.

In particular, a lower portion of the bit line plug 134 extends into the groove and is thus enclosed by the upper portion of the preliminary first plug 117. Therefore, the electrical connection between the bit line 136 and the preliminary first plug 117 is improved.

In example embodiments, the bit line 136 positioned over the preliminary first plug 117 may have a width substantially larger than that of another bit line 136a formed over the preliminary second plug 115. That is, adjacent bit lines 136 and 136a respectively formed over the preliminary first plug 117 and the preliminary second plug 115 may have widths different from each other.

Figure 5:
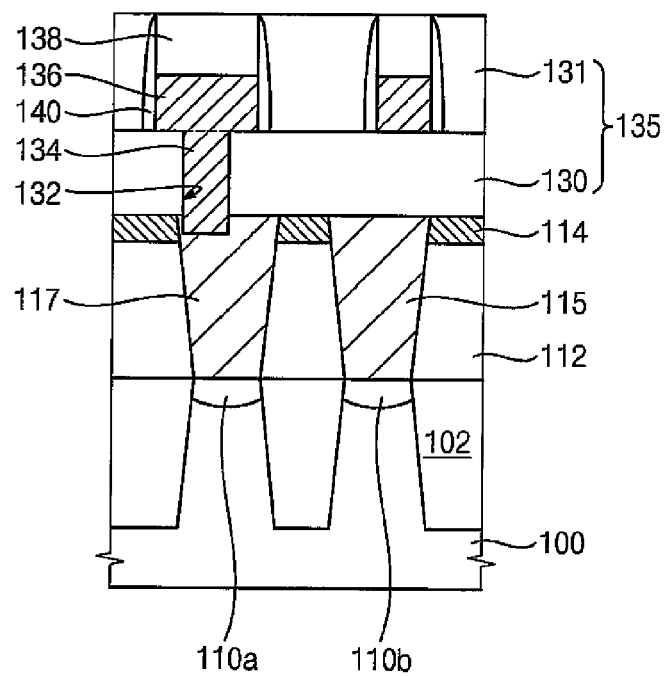

Referring to FIG. 5, a third insulation layer 131 is formed on the second insulation layer 130 to cover the bit line structure. The third insulation layer 131 may be formed, for example, by oxide using a CVD process, a PECVD process, a spin coating process, an HDP-CVD process, etc. In various embodiments, the third insulation layer 131 may be formed using oxide substantially the same as or similar to that of the second insulation layer 130. Alternatively, the third insulation layer 131 may include oxide different from that of the second insulation layer 130.

In example embodiments, the third insulation layer 131 may be planarized by a plararization process, so that the third insulation layer 131 has a level upper face. For example, an upper portion of the third insulation layer 131 may be planarized using a CMP process and/or an etch-back process until the bit line structure is exposed. Hence, the third insulation layer 131 may have a flat upper portion. When the third insulation layer 131 is formed on the second insulation layer 130, an insulation structure 135 is provided over the substrate 100. The insulation structure 135 includes the second and the third insulation layers 130 and 131 where the bit line structure is located.

Figure 6:
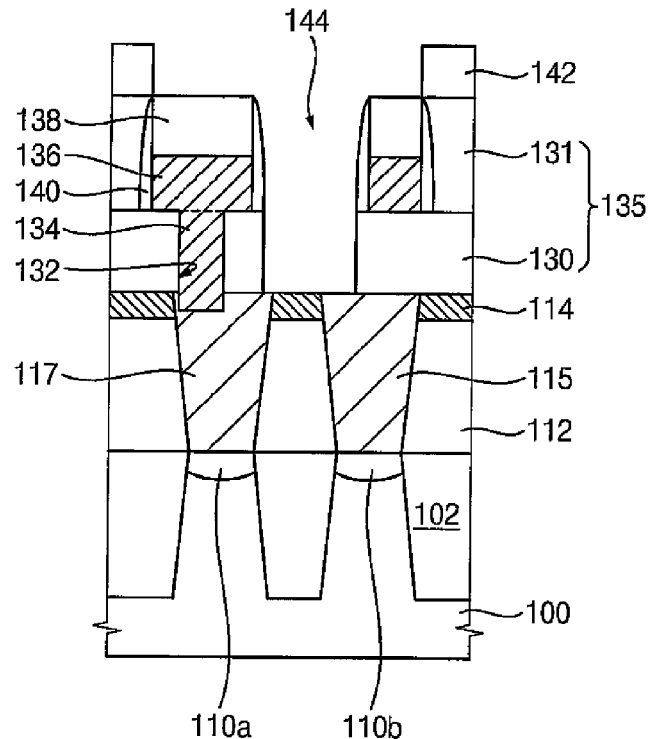

Referring to FIG. 6, a photoresist pattern 142 is provided on the third insulation layer 131. The photoresist pattern 142 may expose the bit line structure and a portion of the third insulation layer 131 between adjacent bit line structures. The third insulation layer 131 and the second insulation layer 130 are partially etched using the photoresist pattern 142 as an etching mask, so that a preliminary opening 144 is formed through the second and the third insulation layers 130 and 131. The preliminary opening 144 may be formed using an anisotropic etching process, for example. Also, the preliminary opening 144 may be self-aligned relative to the bit line. The preliminary opening 144 exposes the etch stop layer 114, an upper peripheral or edge portion of the preliminary first plug 117 and an upper peripheral portion of the preliminary second plug 115.

Figure 7:
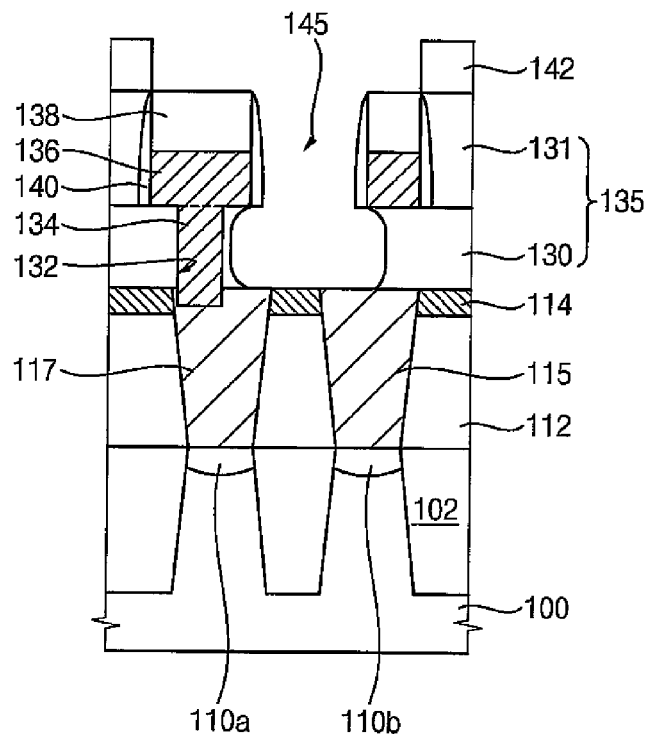

Referring to FIG. 7, the second insulation layer 130 is partially etched using the bit line spacers 140 as an etching mask to form an extended opening 145 from the preliminary opening 144. More particularly, a lower portion of the preliminary opening 144 may be enlarged laterally relative to (e.g., substantially parallel to) the substrate 100 to form the opening 145. In example embodiments, the opening 145 may be formed using an isotropic etching process. The opening 145 has a lower width larger than an upper width because the opening 145 is formed by enlarging the lower portion of the preliminary opening 144. The opening 145 further exposes the upper peripheral portion of the preliminary first plug 117 and the upper peripheral portion of the preliminary second plug 115, as well as the etch stop layer 114. Further, the opening 145 may extend near the bit line plug 134.

In example embodiments, the opening 145 is formed by etching the preliminary opening 144 in a direction substantially parallel to the substrate 100 by a wet etching process. For example, the opening 145 may be formed using an etching solution such as a limulus amoebocyte lysate (LAL) solution that includes deionized water, a hydrogen fluoride (HF) solution and an ammonium fluoride ($NH_4F$) solution, when the second insulation layer 130 includes oxide. When the opening 145 is formed using the wet etching process, previously etched residues generated in forming the preliminary opening 144 may be effectively removed together with etched residues generated in the formation of the opening 145.

Figure 8:
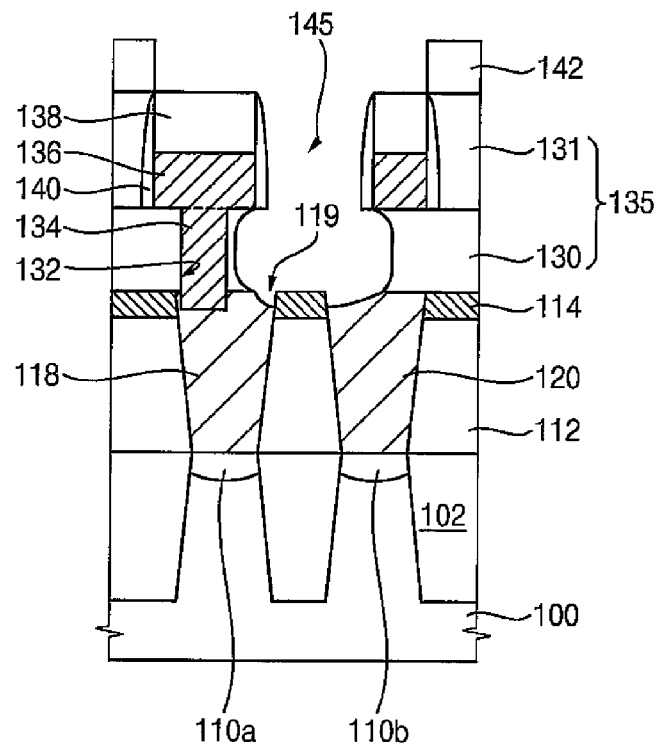

Referring to FIG. 8, the upper peripheral portion of the preliminary first plug 117 is partially etched to form a first plug 118 having a recess 119. In other words, the recess 119 is located on the first plug 118 at the upper peripheral portion. The first plug 118 may be formed by a dry etching process, a wet etching process and/or a cleaning process using plasma, for example. While forming the first plug 118, the upper peripheral portion of the preliminary second plug 115 is also partially etched to thereby form a second plug 120 slightly lower than the etch stop layer 114.

In the dry etching process for forming the first plug 118, an etching gas may include a sulfur hexafluoride ($SF_6$) gas and a chlorine ($C_{12}$) gas, for example. Alternatively, the etching gas may include a hydrogen bromide (HBr) gas, a chlorine gas and an oxygen ($O_2$) gas.

In the cleaning process using plasma, the preliminary first plug 117 may be partially etched by a plasma generated using a gas including sulfur hexafluoride and chlorine, or hydrogen bromide, chlorine and oxygen, for example.

In the wet etching process for partially etching the preliminary first plug 117, an etching solution may include a hydrogen peroxide ($H_2O_2$) solution, an ammonium hydroxide ($NH_4OH$) solution and deionized water. For example, a standard cleaning 1 (SC1) solution may be used as the etching solution for forming the first plug 118.

In example embodiments, the recess 119 on the first plug 118 may have a depth of about 50 Å to about 200 Å. When the recess 119 is formed on the first plug 118, a sidewall of the etch stop layer 114 may be exposed. The upper portion of the first plug 118 may not have a well defined edge or sharp portion because of the recess 119. Meanwhile, the lower portion of the bit line plug 134 buried in the first plug 118 may be separated from the recess 119. However, the recess 119 may be formed adjacent to the lower portion of the bit line plug 134.

Figure 9:
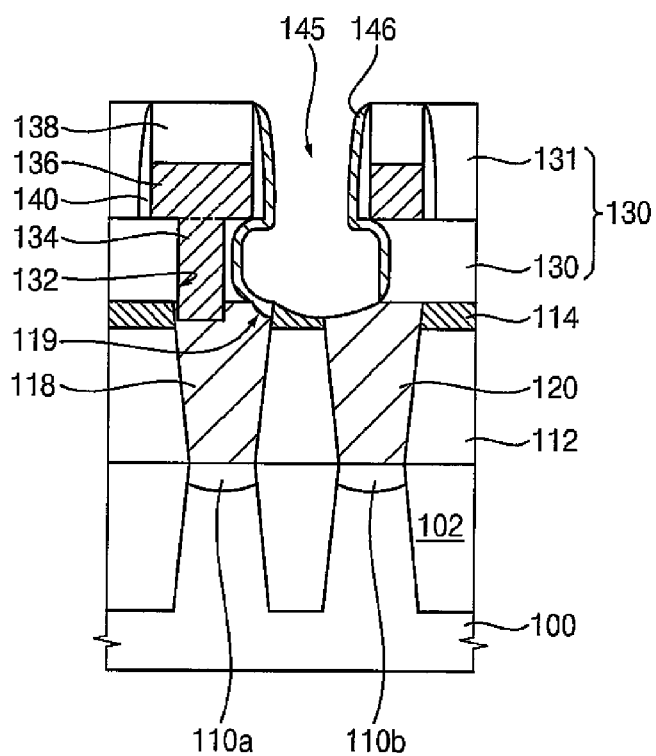

Referring to FIG. 9, a protection layer (not illustrated) is formed on the inside of the opening 145 and the third insulation layer 131. The protection layer may be formed using a material that has an etching selectivity with respect to the second insulation layer 130, the third insulation layer 131, the first plug 118 and the second plug 120. For example, the protection layer may be formed by a nitride, such as silicon nitride, or an oxynitride, such as silicon oxynitride. The protection layer fills the recess 119 of the first plug 118.

The protection layer is etched to form protection spacer 146 on a sidewall of the opening 145 and the recess 119 of the first plug 118. The protection spacer 146 may be formed by an anisotropic etching process, for example. Since the protection spacer 146 fills the recess 119 of the first plug 118, a portion of the protection spacer 146 in the recess 119 may be thicker relative to other portions of the protection spacer 146. When the protection spacer 146 is formed on the first plug 118 and the sidewall of the opening 145, the second plug 120 is exposed. In example embodiments, the etch stop layer 114 may be partially etched in the formation of the protection spacer 146, when the etch stop layer 114 includes nitride substantially the same as or similar to that of the protection spacer 146.

Figure 10:
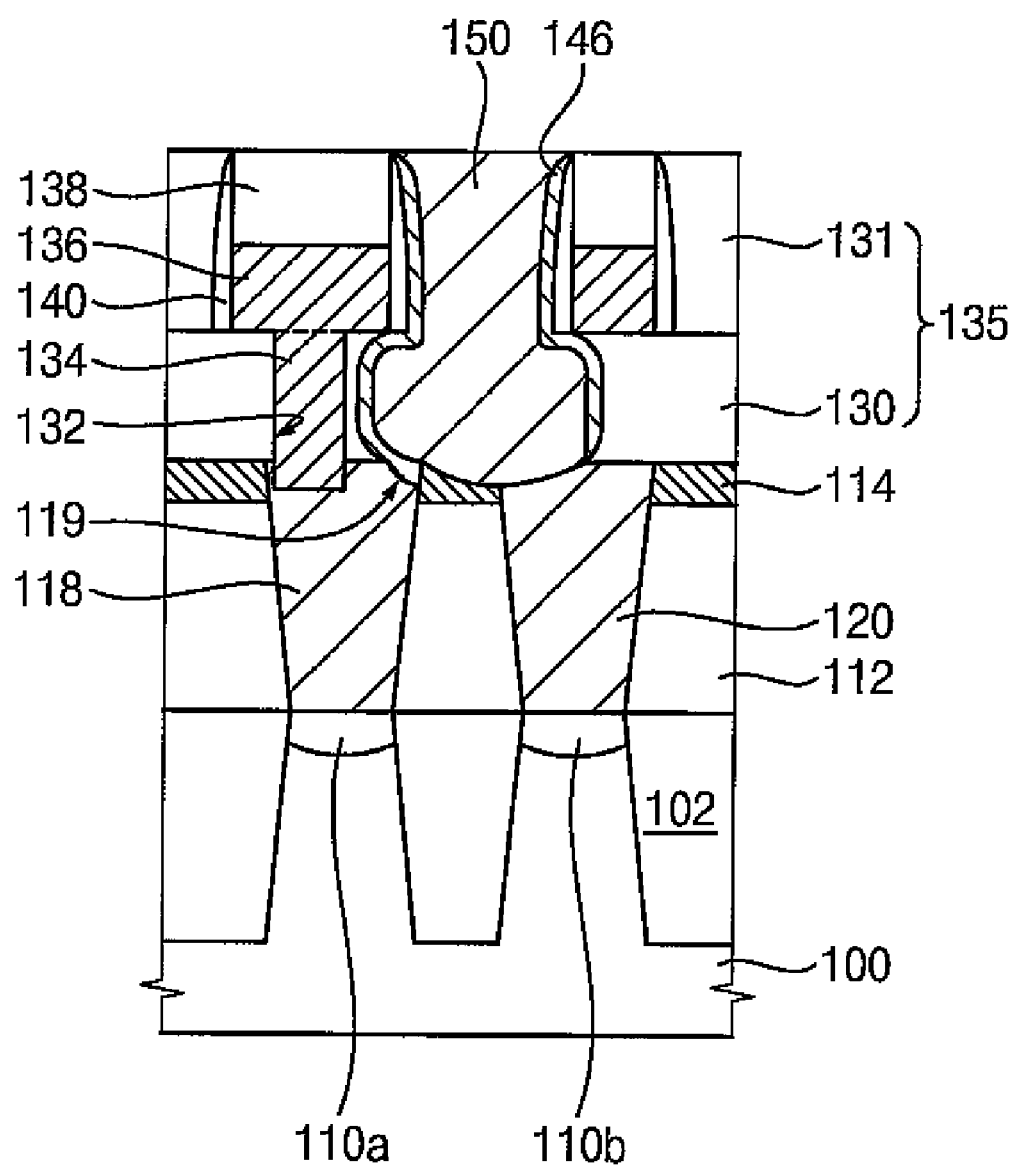

Referring to FIG. 10, a third conductive layer is formed on the third insulation layer 131 to sufficiently fill the opening 145. The third conductive layer may be formed, for example, by doped polysilicon, metal and/or metal compound using a CVD process, an ALD process, a PECVD process, a PLD process, an evaporation process, a sputtering process, etc.

The third conductive layer is removed until the third insulation layer 131 is exposed, so that a pad 150 is formed in the opening 145. The pad 150 may be formed, for example, using a CMP process and/or an etch-back process. The pad 150 is located on the second plug 120, the etch stop layer 114 and the protection spacer 146. The pad 150 may have a lower width larger than an upper width because the pad 150 fills the opening 145 having the same structure. In example embodiments, the pad 150 may be formed by removing the third conductive layer until the bit line structure is exposed when the third insulation layer 131 is planarized. When the pad 150 is formed on the second plug 120, the wiring structure is completed on the substrate 100.

In example embodiments, a lower electrode, a dielectric layer and an upper electrode may be sequentially formed on the pad 150 and the third insulation layer 131, thereby providing a capacitor of a semiconductor memory device on the wiring structure.

Since the protection spacer 146 fills the recess 119 of the first plug 118, the pad 150 is effectively insulated from the first plug 118. Additionally, because the pad 150 has a lower portion that is wider than its upper portion, the electrical connection between the pad 150 and the second plug 120 is improved and the pad 150 has enhanced structural stability. As a result, the wiring structure may have improved electrical characteristics without electrical failures among the pad 150, the first plug 118 and the second plug 120.

According to example embodiments of the present invention, a wiring structure includes a protection spacer formed in a recess on a first plug on a substrate, so that the first plug may be electrically insulated from a pad, preventing electrical shorts between the first plug and the pad. Further, the pad makes electrical contact with a second plug on the substrate without electrical failures because the pad has a lower width larger than an upper width. Therefore, the wiring structure may have improved electrical characteristics and increased structural stability, while reducing or preventing the possibility of electrical failures. When a semiconductor device includes the wiring structure, the semiconductor device may also have improved reliability and enhanced electrical characteristics.

The foregoing is illustrative of the present invention and is not to be construed as limiting thereof. While the present invention has been described with reference to exemplary embodiments, it will be apparent to those skilled in the art that various changes and modifications may be made without departing from the spirit and scope of the present invention. In the claims, any means-plus-function clauses are intended to cover structures described herein as performing the recited function and not only structural equivalents but also equivalent structures. Therefore, it should be understood that the above embodiments are not limiting, but illustrative.

What is claimed is:

1. A wiring structure in a semiconductor device, comprising:
    a first insulation layer located on a substrate;
    a first plug located on the substrate and extending through the first insulation layer, the first plug comprising an upper peripheral portion that defines a recess;
    a second plug located on the substrate and extending through the first insulation layer, the second plug being adjacent to the first plug;
    a second insulation layer located on the first insulation layer, the first plug and the second plug;
    a bit line structure located on the second insulation layer, the bit line structure being electrically connected to the first plug;
    a protection spacer located on the recess of the first plug and a sidewall of an opening in the second insulation layer, the opening exposing the recess of the first plug, the second plug and the sidewall of the bit line structure; and
    a pad located in the opening and contacting the second plug.

2. The wiring structure of claim 1, further comprising:
    an etch stop layer between the first insulation layer and the second insulation layer.

3. The wiring structure of claim 2, wherein the opening further exposes the etch stop layer adjacent to the recess of the first plug, and the pad further covers the etch stop layer.

4. The wiring structure of claim 1, wherein the recess of the first plug has a depth of about 50 Å to about 200 Å.

5. The wiring structure of claim 1, wherein the bit line structure comprises:
    a bit line plug extending through the second insulation layer and contacting the first plug;
    a bit line located on the bit line plug and the second insulation layer;
    a bit line mask located on the bit line; and
    a bit line spacer located on sidewalls of the bit line and the bit line mask.

6. The wiring structure of claim 5, wherein the bit line plug is separated from the recess of the first plug and is partially buried in the first plug.

7. The wiring structure of claim 1, wherein the pad comprises a lower portion and an upper portion, the lower portion being larger than the upper portion.

8. The wiring structure of claim 7, wherein the lower portion of the pad is enlarged in a direction substantially parallel to the substrate.

* * * * *